(12) United States Patent
Bartels

(10) Patent No.: US 10,914,771 B2
(45) Date of Patent: Feb. 9, 2021

(54) SPECTRUM ANALYZER WITH INCREASED REAL-TIME BANDWIDTH

(71) Applicant: AARONIA AG, Strickscheid (DE)

(72) Inventor: Oliver Bartels, Munich (DE)

(73) Assignee: AARONIA AG, Strickscheid (DE)

( * ) Notice: Subject to any disclaimer, the term of this patent is extended or adjusted under 35 U.S.C. 154(b) by 360 days.

(21) Appl. No.: 15/967,710

(22) Filed: May 1, 2018

(65) Prior Publication Data
US 2018/0246152 A1  Aug. 30, 2018

Related U.S. Application Data

(63) Continuation of application No. PCT/EP2017/000019, filed on Jan. 9, 2017.

(30) Foreign Application Priority Data

Jan. 12, 2016 (DE) .................. 10 2016 000 254

(51) Int. Cl.
G01R 23/167 (2006.01)
G01R 23/16 (2006.01)

(52) U.S. Cl.
CPC .......... G01R 23/167 (2013.01); G01R 23/16 (2013.01)

(58) Field of Classification Search
None
See application file for complete search history.

(56) References Cited

U.S. PATENT DOCUMENTS 3,573,446 A  4/1971 Bergland
3,634,760 A  1/1972 Murtin et al.
(Continued)

FOREIGN PATENT DOCUMENTS

DE       19530812 A1   1/1996
DE     102007036828 A1   2/2009
EP       1592131 B1   6/2007

OTHER PUBLICATIONS

International Search Report and Written Opinion for PCT Patent App. No. PCT/EP2017/000019 (dated Apr. 19, 2017) with English language translation of the ISR.
(Continued)

Primary Examiner — Gregory J Toatley, Jr.
Assistant Examiner — Brandon J Becker
(74) Attorney, Agent, or Firm — Cermak Nakajima & McGowan LLP; Malcolm K. McGowan

(57) ABSTRACT

Conventional real-time spectrum analyzers have a degree of technical complexity in the hardware which increases disproportionately as the analysis bandwidth increases for Fourier transformations of the measured sampling values. When using high analysis bandwidths, a detailed resolution is not needed of each analyzed individual frequency on the time plane at the same time; instead, detection of the presence of short pulses can be important as well. For this application, mixing sampling values on the time plane using a variable auxiliary frequency allows the sampling rate to be reduced, in that the bandwidth is maintained but a compression is carried out on the time plane. A very high time resolution which far exceeds the capabilities of conventional real-time spectrum analyzers can additionally be achieved overall for the analysis bandwidth, the time resolution then being computationally assignable to the individual frequencies for signal forms, in particular pulses, which occur in practice.

18 Claims, 1 Drawing Sheet

(56) References Cited

U.S. PATENT DOCUMENTS

| | | | |
|---|---|---|---|
| 3,636,333 A | 1/1972 | Klund | |
| 3,778,606 A | 12/1973 | Schmitt et al. | |
| 3,984,669 A * | 10/1976 | Lehmann | G01R 23/00 |
| | | | 708/405 |
| 4,093,989 A | 6/1978 | Flink et al. | |
| 5,262,957 A * | 11/1993 | Hearn | G01R 23/16 |
| | | | 324/76.19 |
| 6,377,617 B1 * | 4/2002 | Nara | G01R 23/16 |
| | | | 375/224 |
| 6,378,360 B1 | 4/2002 | Bartels | |
| 6,484,111 B1 * | 11/2002 | Nara | G01R 23/16 |
| | | | 702/106 |
| 6,664,770 B1 | 12/2003 | Bartels | |
| 2010/0153044 A1 | 6/2010 | Nara | |
| 2011/0206163 A1 * | 8/2011 | Lowdermilk | G01R 23/16 |
| | | | 375/316 |
| 2013/0064328 A1 | 3/2013 | Adnani et al. | |
| 2013/0158923 A1 * | 6/2013 | Stanton | G01R 23/18 |
| | | | 702/76 |
| 2014/0306688 A1 * | 10/2014 | Crooks | G01R 23/16 |
| | | | 324/76.23 |
| 2014/0378079 A1 | 12/2014 | Adnani et al. | |
| 2015/0054566 A1 * | 2/2015 | Bordow | H03M 1/12 |
| | | | 327/336 |
| 2015/0149122 A1 | 5/2015 | Cipri | |
| 2017/0187556 A1 * | 6/2017 | Acker | G06F 17/14 |

OTHER PUBLICATIONS

Search Report for German Patent App. No. 102016000254.9 (dated Oct. 31, 2016).

\* cited by examiner

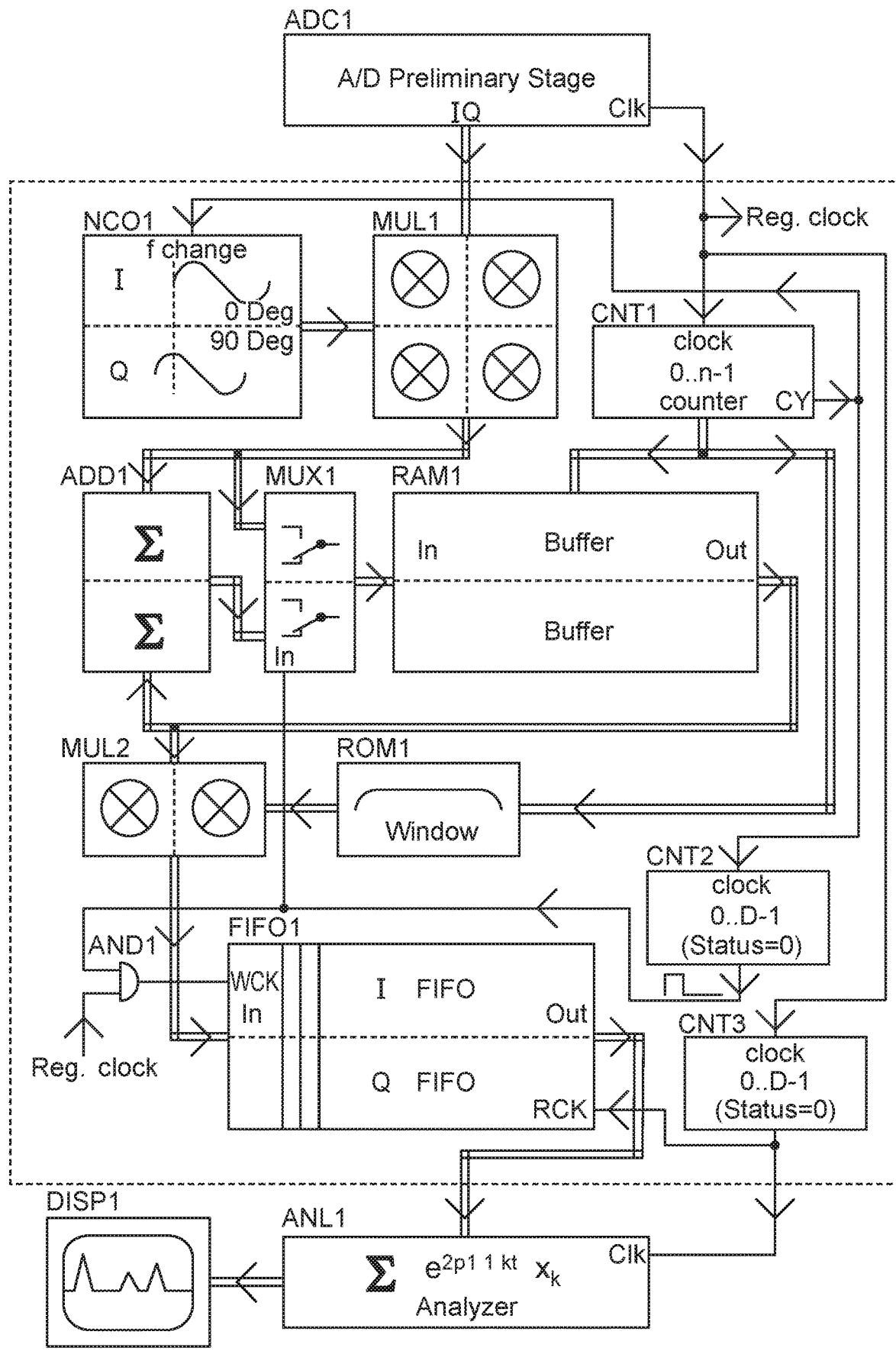

SPECTRUM ANALYZER WITH INCREASED REAL-TIME BANDWIDTH

This application is a Continuation of, and claims priority under 35 U.S.C. § 120 to, International Application No. PCT/EP2017/000019, filed 9 Jan. 2017, and claims priority under 35 U.S.C. §§ 119, 365 therethrough to German App. No. 10 2016 000 254.9, filed 12 Jan. 2016, the entireties of which are incorporated by reference herein.

BACKGROUND

Field of Endeavor

This application relates to the construction of real-time spectrum analyzers having a very high analysis bandwidth while keeping technical hardware complexity within acceptable limits and enabling, in particular, an implementation thereof as a portable handheld device.

Brief Description of the Related Art

Conventional measurement instruments of the aforementioned construction type, such as, for example, real-time spectrum analyzers by the usual manufacturers of measurement instruments, have a front end that detects the values or signals to be measured, such as, e.g., a high-frequency signal. In most cases, the output signals of the front end are then routed to one or several analog-digital converters, a digital signal processing unit, which is embodied as a universal processor, signal processor or within an FPGA (field-programmable gate array) or an IC (integrated circuit) customized according to the customer's wishes, whereby further filtering and scaling operations that are to be performed on the measured values are facilitated. U.S. Pat. No. 4,093,989 A introduces the topic. U.S. Patent App. Publ. No. 2015/0149122 A1 further contains a detailed description of a handheld device according to the prior art.

The usual path for achieving a spectral analysis in real time envisions the use of a fast Fourier transform (FFT), according to U.S. Pat. No. 3,634,760 A and U.S. Pat. No. 3,573,446 A. The term "real time" therein denotes that, no matter the specific point in time when a pulse of any frequency occurs within the bandwidth—i.e., the span—that is to be analyzed, the analyzer will recognize and visualize the same. The connection according to the laws of nature between time resolution and frequency resolution in a FFT, which can attenuate the analyzed power of the pulse per FFT channel or filter bank channel, must be distinguished from a sweep, where the pulse is not even recognized with certainty when the receiver specifically does not analyze this but another pulse frequency at a particular point in time. Due to advances in the prior art, such devices can now be produced in a more convenient format instead of the suitcase format that has been customary until now. These advances are further aided by progress that has been achieved in skillfully combining analog high-frequency components with digital signal processing; cf., for example, DE 19530812C2 concerning the digital elimination of mirror frequencies.

Customers have the desire to analyze bandwidths that are as large as possible in real time. According to the Nyquist-Shannon sampling theorem, however, a received signal of a particular bandwidth must be sampled using a particular bandwidth of at least double the sampling frequency of this bandwidth in order to avoid ambiguities.

On the one hand, sampling itself is unproblematic, due to the advances in integrated analog-digital converter (ADC) technology—specifically owing to pipeline constructions—in most instances also for high bandwidths; on the other hand, however, based on the laws of nature, it is not possible to avoid high sampling rates of the—individual or combined—ADC, whereby, automatically, there also results a very large data volume per time unit that must, in subsequent processing steps, be routed, in most instances, to a Fourier transform or a polyphase filter bank (PFB).

Again, technological progress facilitates, in principle, the processing of high data rates in increasingly smaller spaces; however, hardware limits are quickly met specifically in mobile devices, since such hardware must also be supplied with power. This means, if a high level of computing power is required, this will dramatically reduce the life of the battery, a fact that is common knowledge concerning modern mobile telephones.

Furthermore, a frequency-analyzed data flow must also be routed to a visualization device; this creates additional demands on the computing power.

Though not able to avoid this connection that is governed by the laws of nature—Nyquist-Shannon—altogether, the question now emerges if it is possible to perhaps find a feasible technical solution that will reduce the data volume already immediately downstream of the analog-digital converter.

Approaches to date have focused primarily on the analog part; for example, EP 1592131B1 proposes to use a continuous sweep instead of gradual retuning of the receiving frequency, then compensating for the effect thereof prior to implementing the FFT to reduce transient times, thereby accelerating the measurement.

Naturally, this helps in increasing resolution and analyzed bandwidth; however, it is highly disadvantageous that, despite the increased measurement speed, we no longer have a spectral measurement in real time. This means that the spectrum analyzer does not visualize individual pulses with frequencies that are specifically not implemented in the superhet receiver at a given time but that are indeed within the frequency span of the bandwidth that is to be examined.

Another approach envisions a division into several frequency bands, followed by an independent analysis thereof and subsequent recombination of the measured results. U.S. Patent App. Publ. Nos. 2013/0064328 A1 and U.S. 2014/0378079A1 outline detailed descriptions of the measurement system that is made up of a plurality of receivers according to the prior art. A related disadvantage is the high level of complexity associated with the need for a plurality of receivers, which, for the most part, precludes any use as a mobile system.

A further approach is proposed in U.S. Patent App. Publ. No. 2014/0306688 A1, which is basically a combination of the analog approach by means of a sweep and/or programmed frequency hopping and the possible multiplication of the number of receivers. This is achieved by utilizing the USB interface that is commonly available on personal computers, even for several receivers, and shifting the signal processing step to a personal computer. Disadvantageously, this solution always requires a corresponding external computer; moreover, the sweep does not allow for conducting an analysis in real time, rather, only one time-limited section is available for each frequency band.

Also known in the art are measurement instruments that work in parallel with different analysis bandwidths to thereby facilitate a zoom functionality. U.S. Patent App. Publ. No. 2010/0153044 A1 demonstrates an example for this approach, though the described setup, unfortunately, does not increase the analysis bandwidth overall. These solutions that have been proposed so far suffer from small analysis bandwidths as well as, moreover, limited time resolution. Related attempts have been made at compensating for this deficit by dividing the data flow into different partial data flows in the digital range, a separate analysis of said flows, and recombining the same afterwards in the time plane; see accordingly U.S. Patent App. Publ. No. 2015/0054566 A1. Ultimately, however, even with added complexity, no improvement is achieved relative to a real-time spectrum analyzer in the classical sense.

New approaches in digital signal processing are clearly needed if the problems that have been described are to be resolved, because a distribution to different frequency bands alone is incapable of providing a solution. An approach of this kind relative to multi-stage FIR filters, especially for spectrum analyzers, has been described in LIM, Hyukjin; LEE, Seongjoo: Multi-stage FIR filter design for portable digital spectrum analyzers, in ICEIC 2014 Conference, Jan. 15-18, 2014, Kota Kinabalu, Malaysia, pp. 243-244. This article captions a multi-stage, recursive filter structure that derives its efficiency from the fact that a classical spectrum analyzer, contrary to a communications system, does not need to be analyzed continuously. However, by definition, this is the criterion for excluding this solution from use for a spectrum analysis in real time, which, indeed, is to offer a continuous examination of the total frequency band for such signals even if they only appear briefly.

SUMMARY

One of numerous aspects of the present disclosure includes remedying this deficit and enabling an analysis of large bandwidths in real time, albeit with minimal power consumption. Considered therein is the fact that customers indeed do not demand maximum resolution relative to time and frequency per individual FFT channel at the same time; rather, customers demand the real-time characteristic. Therefore, a high-frequency signal may not remain undetected as a matter of principle, even if it only occurs briefly. Quite acceptable, on the other hand, is averaging the power associated with a change within the duration of the analysis. Naturally, high time resolution is desirable in cases closely related to practical applications, such as, for example, in the event of a rapid change of a specific signal. Since rapid time changes necessarily always imply a level of fuzziness of the frequency, a related high frequency resolution is not required at the same time.

The problem can be solved by the receivers and monolithic, integrated circuits or assembly for such receivers as described herein, wherein the initially reduced time resolution can additionally be dramatically increased, the functionality of which will be explained herein based on an exemplary embodiment of a real-time spectrum analyzer that contains the receiver.

BRIEF DESCRIPTION OF THE DRAWINGS

The invention of the present application will now be described in more detail with reference to exemplary embodiments of the apparatus and method, given only by way of example, and with reference to the accompanying drawings, in which the single drawing FIGURE illustrates an exemplary embodiment of a wiring diagram of a receiver.

DETAILED DESCRIPTION OF EXEMPLARY EMBODIMENTS

The drawing FIGURE shows a comprehensive wiring diagram of a receiver according to principles of the present invention. The front end with analog-digital converter (ADC 1), usually according to an analog superhet high-frequency part, corresponds to the known prior art. The analysis part (ANLI) executes a parallel analysis of all frequencies in the sampled signal, which occurs preferably by a rapid—fenestrated—short-time Fourier transform or by polyphase filter banks, if need be even with several filter banks that are offset relative to each other in terms of time and frequency, as described based on the receiver in DE 102007036828B4.

Wavelet transforms are also expedient; in the present context, particularly in the form of wavelet packet decomposition, or different Cohen's class transforms.

The measured results for the individual frequencies and/or FFT channels as results of the computations in the analysis part (ANLI) can be nicely visualized in an easy-to-read format in the case of the real-time spectrum analyzer on the display unit (DISPI) with graphics controller, preferably as a histogram (how often a combination of an amplitude and frequency occurs is indicated by a color code) or a waterfall display diagram. In the case of increased time resolution after the fact and for the high bandwidth at any rate, a zoom functionality is implemented, if need be, that visualizes, as selected by the user, only a part of the diagram.

First, the analog-digital analyzer (ADCI) detects the total spectrum that must be analyzed and, if need be, limits the band in advance to the selected analysis frequency range—span—using analog or digital filters. The present embodiment utilizes internally, and nowadays customary I/Q data in the computations, i.e., each sampling value is represented by an in-phase (I) numeric value and a quadrature (Q) numerical value sampled with a 90-degree phase offset relative to the former, wherein the phase offset relates to a zero-carrier located in the center of the analysis frequency span. Correspondingly, this is an analytical signal represented by a complex number. Since the sampling value therefore includes two dimensions, it is possible to represent both positive and negative frequencies. Thus, the maximum bandwidth that can be visualized corresponds according to Nyquist-Shannon directly to the sampling rate; but, due to the two numerical values per sampling value, the Nyquist-Shannon law has been obeyed once again.

A new aspect related to the receiver is, as seen in the drawing FIGURE and framed by the perforated line, the signal processing block. At its core, the block includes a buffer store implemented as a random-access memory (RAM1) that is, depending on the position of the input multiplexer (MUX1), described directly with each input clock (CLK) by a sampling value or, however, by the sum of the sampling value, so far present at this storage address, and the new value, formed by an adder (ADD1). For better clarity, the usual clock lines (reg. clk) for the input clock in the drawing, were only marked insofar as absolutely necessary for a good understanding.

The address counter (CNTI), which counts in increments of one each sampling value from the front end—in turn controlled by the sampling clock (CLK)—controls the consecutive filing of the sampling values in the RAM and/or—depending on the position of the input multiplexer (MUXI)—the incremental accumulation thereof. After "n" sampling values, the counter (CNTI) rolls over and starts counting anew, whereby the first sampling values are overwritten.

The cycle counter (CNT2) decides if values are filed or accumulated; it counts in increments of one after the rollover (CY) of the address counter (CNTI). This counter counts D cycles, supplies an output signal for the total first cycle that, on the one hand, switches the multiplexers (SW1) such that the buffer is overwritten with new values.

On the other hand, due to the AND operation of the output signal of the cycle counter (CNT2) with the input clock of the sampling values, only in the first cycle the old and fully accumulated sampling values that are no longer included in the summation are now routed via an AND gate (ANDI) to a write clock (WCK)—parallel to the writing of new sampling values—to a first-in-first-out store (FIFO1). Controlled by the sample cycle counter (CNT3), one output value from the FIFO store (FIFO1) is, furthermore, handed over to the analysis section (ANL1) relative to each D-th input clock by applying a read clock pulse (RCK) to the FIFO.

This results in a reduction of the sampling rate by a factor D, wherein even filling of the FIFO storage is always ensured, in that the FIFO storage accepts (WCK) the values from the buffer (RAM1) only in each D-th address cycle and in that, vice versa, an output clock pulse will also be handed over to the FIFO (RCK) and to the analysis unit (ANL1) only at the time of each D-th sampling clock (CLK).

This way, D of consecutive sampling values, which are subsequent to each other at distances n, of the analog-digital converter (ADC1) of the front end are summed—any possibly needed scaling at fixed-point numbers has been omitted from the drawing FIGURE for better clarity—and handed over again in that order of input to the analysis unit (ANL1). Thus, the data rate is reduced by a factor D, yet not to the detriment of the bandwidth but, as desired, at the expense of the time resolution.

It is a perfectly valid objection that, in view of this type of accumulation, any frequency-dependent interference may considerably distort the measured results; depending on the phase position, the signal could be completely obliterated—namely, when the factor D is an even umber and when, after n sampling values, the signal that is to be measured is phase-rotated by 180 degrees. Alternatively, a constructive elevation by a factor D with the same phase position of the signal is possible after n sampling values.

At this point, the feature of the, in the example, complex multiplication of the sampling values prior to accumulation is activated by the—for complex I/Q sampling values internally needed as fourfold—multiplier (MUL1) upstream of the multiplexer (MUX1) with a variable frequency that is generated, in the example in a particularly preferred embodiment, by a numerically controlled oscillator (NCO1). The same usually has an internal phase accumulator as well as sine and/or cosine tables—if need be, with interpolation—and is also referred to as a DDS (direct digital synthesizer) in the pertinent technical jargon, wherein this term is also used in the same manner to specify modules with an integrated digital-analog converter.

The numerically controlled oscillator (NCO1) now receives from the address counter (CNT1) a signal, also at every rollover and therefore the beginning of a new cycle, causing the same to change frequency. The generated frequencies therein must be chosen in such as manner as to ensure that the shift of the frequencies of the input signal supplied by the front end is such between the D-cycles so as to remain within the analysis filter bandwidth and/or channel bandwidth of the fast Fourier transform.

Surprisingly, a complete obliteration is no longer possible for discrete frequencies to be analyzed, especially for larger D. In fact, shifting the phase position on the unit circle means that, even in unfavorable cases, sufficient overlaps remain, nonetheless, that provide useful results and/or that compensate destructive by constructive interferences. The available spectrum for modulated signals is abundant at any rate.

Naturally, amplitude errors may occur as a function of the overlaps and selected frequencies of the numerically controlled oscillator (NCO1); however, to be considered in this context is that, in matters of high-frequency engineering, even factors are only considered as minimal db offsets because of the taking of logarithms. The higher the reduction factor D, assuming a suitable selection of the variable frequencies, the lower, surprisingly, on average, the measurement error.

Thus, instead of the usual reduction of the bandwidth for a reduction of the sampling rate, a time compression while preserving the full analysis bandwidth, has been achieved.

The selection of the used heterodyne frequencies of the numerically controlled oscillator (NCO1) and the selection of the size n of the buffer store are naturally linked via the rate law of telecommunications. To be able to implement a sufficiently small difference in frequency below the frequency dissolution of the analysis unit, the recorded time length must, at any rate, correspond to the inverse value of the difference in frequency.

It is possible therein to include negative frequencies in case of the I/Q visualization, with the selection of the frequencies being determined in advance depending on factor D based on a table or—especially when D is high—quasi at random within a certain span. It is also possible therein to include, from the outset, an additional large frequency offset, only keeping the span of the change small, particularly if the goal is to eliminate DC offset problems of the frequency analysis in this way using the same multiplier.

Moreover, instead of a heterodyne frequency, it is possible to modify the phase of the incoming signal directly; this corresponds to multiplication by frequency zero with variable phase. Equally conceivable is a combination of phase and frequency changes.

However, artefacts can result, especially when utilizing phase changes, but also when using frequency hops. One particularly preferred embodiment, therefore also envisions—coupled with the address counter (CNT1)—a fenestration of the output signal by combining a window-type table value store (ROM1) and a scaling multiplier (MUL2) that multiplies the real window values with the complex output signal.

This way, it is avoided that the hard frequency or phase transitions occurring at the end of a cycle will result in secondary wave artefacts in the output signal, which would erroneously indicate a measured frequency in places where there is none. Alternatively, it is possible to address this problem by a continuous sweep of the frequency of the numerically controlled oscillator (NCO1) over the total cycle length.

In a particularly preferred embodiment, the time resolution in measurements with practical relevance is additionally increased once again. This is achieved by a completely redundant signal path; in the example, by deriving the sampling values upstream of the multiplier (MUL1) that are, for example, routed directly to a CORDIC (COordinate Rotation DIgital Computer) unit—omitted from the drawing FIGURE.

The CORDIC unit provides the amplitude and phase for each complex sampling value in the I/Q visualization. While the amplitude could simply be squared or visualized, if a logarithm is taken, simply provided with a factor, in a diagram over time, the amplitude is incorporated in the time-frequency diagram in that, for an analyzed frequency and/or a channel, in places with a time change, that change is not visualized as a linear transition with minimal time resolution. Rather, the change can be modelled—by multiplication within the meaning of an AND operation or, for example, fuzzy logic operators—in such a way that the course thereof corresponds to the time change of the total signal.

Thus, while such analyzed frequencies and/or channels, which are between two—more remote and therefore having low time resolution—analysis points in time that include no change whatsoever or only a minimal change, that are not changed whatsoever or only minimally by the computation, this computation method assumes, consistent with practical concerns, that a rapid change of the total signal will affect such frequencies or channels that also indicate a change during the time period in question. Since rapid signal change is accompanied by the use of a high bandwidth at any rate, selective frequency resolution is not consistent with practical concerns in this case.

In addition, it is possible to visualize very short pulses, in parallel and independently of the frequency analysis, directly on the display; for example, by a superimposed image to be able to securely detect UWB interference—ultrawide band.

Furthermore, it is therein possible to determine the center frequency of the established wideband measured values from the CORDIC algorithm by a time derivative of the phase—if need be, with rollover accumulation. This allows for the possibility, in addition, of calculating a frequency mask that assigns the detected rapid change, preferably to those analyzed frequencies or channels that are within the center frequency span. In another step, it is possible to determine the width of the frequency mask by establishing the variance and/or standard deviation or further derivative of the frequency. By the very nature of the matter, a Gauss function is especially well suited as a basis for the frequency mask. In theory, it is also possible—though involving added complexity—to perform a preliminary filter and distribution step to several frequency spans prior to applying the CORDIC algorithm, thereby allowing for the application of several frequency masks to the time-frequency diagram that is to be provided. In extreme cases, this is a process involving a plurality of different time-frequency resolutions, similarly to a rapid wavelet transform.

Moreover, the redundant signal path is also an excellent option for use as the basis for simple, power-dependent and complex triggers; for example, a trigger could be activated in this context in response to the observance or non-observance of a GSM power mask.

If the user wishes to analyze an even larger frequency span whose bandwidth is no longer covered by the analog-digital converter, the same hardware can be used for this purpose with minor modifications—however, no longer in real time. Between the individual analysis section, the frequency of the local oscillator of the front end—if the usual superhet receiver according the prior art is present—is accordingly retuned in such a way that each next frequency segment, respectively, of the spectrum, which is to be analyzed, is detected. The retuning is performed particularly preferably precisely at the time when the signals fall simultaneously into the span of the decrease of the window produced by the window generator (ROM1, MUL2), whereby interference during the retuning step is minimized. This is preferably achieved via reprogramming of a digital DDS oscillator—that is mixed with the analog local oscillator. The actual local oscillator signal is, in that case, the mixed product, wherein it is possible to use a vector modulator as a mixer.

In addition, the information concerning the respectively resulting receiver frequency span is routed, for overlaying or sequencing the acquired spectra, to the digital analysis section, in that the information is brought along in a parallel step, while the sampling values are processed in I/Q visualization. Especially in the context of pipeline architectures, this has the advantage that any retuning is de-coupled from the duration of the analysis.

It should be noted in this context that the visualization in the drawing FIGURE has been simplified in that pipeline registers have been omitted for better clarity. In practical applications, diverse pipeline registers will be used to accelerate the data throughput between reading out the measured values from the buffer (RAM1) and the subsequent steps, such as adder (ADD1) and multiplexer (MUX1), in the same way, for example, in the complex multiplier (MUL1)—especially at the transition to the two adding stages of the complex multiplier that have been omitted.

Accordingly, the address used for writing the data into the buffer (RAM1) will be reduced either via the address pipeline registers or via subtraction of the number of the pipeline steps in contrast to the address that is used for reading.

The buffer (RAM1) is, just like the FIFO (FIFO1), a dual-port RAM, as is customary for FPGA and integrated circuits; according to the prior art, read and write address counters are needed in addition, which incrementally count upwards during a read and/or write process by the read clock (RCK) or write clock (WCK). The AND gate (AND1) is also rendered schematically in the drawing; a synchronous implementation with a write-enable will be preferred in practical applications. Upon start-up of the signal processing, naturally, the first read-out process from the FIFO must be achieved by an additional logic with a slight time offset, thereby always providing for a sufficient fill level of the FIFO store.

Preferably, the systems and methods described herein are employed in a real-time spectrum analyzer enabling it to visualize a time-frequency diagram, preferably as a waterfall diagram, as well as a spectrum in real time, preferably a histogram. As outlined above, it is important that the amplitudes associated with the individual frequencies in the spectrum are analyzed in parallel operations, respectively.

To construct a mobile real-time spectrum analyzer with acceptable power consumption, the implementation is preferably as follows: pre-processing of the measured values, particularly FIR- or IIR filtering, possible mirror frequency elimination (cf. DE 19530812C2), reducing, in a manner described herein, the sampling rate via time compression, redundant signal path as described herein, subsequent spectral transformation by polyphase filter banks thereafter, or fast Fourier transform, calibration, computation of the amplitude or power, for example by a CORDIC algorithm, possibly it is necessary to take a logarithm, scaling, and subsequently using the signal path of the graphics controller for a quick visualization of the measured results on a single monolithic, integrated circuit, or FPGA (field programmable gate array). Individual processing steps therein can be set up in a pipeline form, or even in processor form, or a mixed form.

The systems and methods described herein allow for visualizing spectra of very great analysis bandwidths in real time on a mobile measurement instrument with minimal power consumption, whereby this is a considerable improvement relative to the solutions in use to date in form of cumbersome measurement instruments in box formats.

While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

I claim:

1. A receiver, measurement receiver, or spectrum analyzer useful for a received spectrum, comprising:
at least one analog receiver for receiving an incoming signal, including at least one analog-digital converter located downstream, whereby the received spectrum is visualized as a digital data flow signal;
at least one digital analysis section for the digital data flow signal which executes at least one analysis in the frequency plane or time-frequency-plane having a particular frequency resolution;
at least one interposed reduction unit for reducing the sampling rate of the digital data flow signal by a particular reduction factor;
wherein the incoming signal is first multiplied by a signal having at least one variable frequency or phase and then cyclically accumulated in at least one buffer store;
wherein the cycle comprises a plurality of sampling values and the cyclic accumulation occurs with time-wise corresponding sampling values of at least one previous cycle;
wherein the at least one buffer store with accumulated measured values is read corresponding to the reduction factor after at least one defined number of cycles, wherein the buffer store is purged of old sampling values; and
whereby the analyzable bandwidth of the received spectrum is preserved to the detriment of an extended duration of an analysis section while reducing the sampling rate.

2. The receiver according to claim 1, wherein:
the signal having at least one variable frequency is generated by digital synthesis (DDS) or a numerically controlled oscillator;
the frequency or phase changes, respectively, after each cycle, to a new frequency or phase; and
said new frequency or phase is selected at random within a certain framework or from a frequency table or by a calculation rule.

3. The receiver according to claim 1, wherein data that are routed to the analysis section are subjected to fenestration, oriented relative to the length of the cycle.

4. The receiver according to claim 3, wherein fenestration employs a window selected from the group consisting of von-Hann, raised cosine, Hamming window, Blackman window, and Kaiser window.

5. The receiver according to claim 1, wherein the adaptation of the block-oriented output of the buffer store is directed to a continuous sampling rate of the analysis section by a FIFO store of elastic buffer store.

6. The receiver according to claim 1, wherein the data are complex I/O data, optionally band-limited via pre-processing.

7. The receiver according to claim 1, wherein the analysis section downstream performs a frequency analysis by at least one fast short-time Fourier transform or wavelet transform or wavelet packet decomposition or Cohen's class transform, or by at least one polyphase filter bank.

8. The receiver according to claim 7, comprising several transforms or filter banks which are spectrally and temporally offset, whereby a frequency analysis in real time with a high level of coverage can be achieved.

9. A receiver, measurement receiver, or spectrum analyzer useful for visualizing a time-frequency diagram comprising:
at least one analog receiver with at least one analog-digital converter located downstream and a digital analysis section that disassembles a signal into a plurality of analysis frequencies for visualization purposes, or according to claim 1;
wherein the time resolution of the narrowband analysis frequencies is increased especially in such time sections in which they change their amplitudes, in that redundantly, by at least one further signal path, wideband signals are gathered that describe the amplitude or power in at least one frequency block that is to be analyzed, having a plurality of individual analysis frequencies examined by the analysis section, with high time resolution, and these measured values are combined with the measured values of the examined analysis frequencies having reduced time and high frequency resolution by multiplication or fuzzy logic operators or correlation.

10. The receiver according to claim 9, wherein the gathering of wideband measured values comprises taking over or optionally coarse filtering of the sampling values of the analog-digital converter and subsequent squaring, rectification, or CORDIC amount computation.

11. The receiver according to claim 9, wherein a center frequency of the gathered wideband measured values are determined, and a frequency mask that is centered relative to said central frequency is used to implement during said combining the assignment of the wideband measured values with increased time resolution relative to the narrowband measured values with increased frequency resolution.

12. The receiver according to claim 11, wherein the frequency mask has a width established by determining the variance and/or standard deviation or further derivative of the frequency, using a Gauss function for the frequency mask.

13. The receiver according to claim 3, wherein retuning of the frequency of at least one local oscillator is carried out between the individual analysis sections, which is in the span of the decrease of the window, whereby interferences during retuning are minimized.

14. The receiver according to claim 13, wherein the retuning is implemented by reprogramming a digital DDS oscillator mixed with the analog local oscillator.

15. The receiver according to claim 13, wherein information concerning each resulting received frequency range is routed further to the digital analysis section for the purpose of graphic superimposition or sequencing of the obtained spectra, whereby an even greater frequency span can be monitored.

16. A monolithic, integrated circuit, or assembly for a receiver according to claim 1, wherein the reduction unit for reducing the data rate is integrated therein.

17. A method of analyzing a received spectrum with a system, whereby the received spectrum is visualized as an incoming digital data flow signal, the method comprising:
- executing at least one analysis of said incoming digital data flow signal in the frequency plane or time-frequency-plane having a particular frequency resolution with at least one digital analysis section of said system;
- reducing the sampling rate of the incoming digital data flow signal by a reduction factor with at least one interposed reduction unit of said system;
- first multiplying said incoming digital data flow signal by a signal having at least one variable frequency or phase and then cyclically accumulating in at least one buffer store;
- wherein the cycle comprises a plurality of sampling values and said cyclical accumulating occurs with timewise corresponding sampling values of at least one previous cycle;
- reading the at least one buffer store with accumulated measured values corresponding to the reduction factor after at least one defined number of cycles, and purging the buffer store of old sampling values; and
- whereby the analyzable bandwidth of the received spectrum is preserved to the detriment of an extended duration of an analysis section while reducing the sampling rate.

18. A receiver, measurement receiver, or spectrum analyzer useful for a received spectrum, comprising:
- at least one analog receiver for receiving an incoming signal, including at least one analog-digital converter located downstream, whereby the received spectrum is visualized as a digital data flow signal;
- at least one digital analysis section for the digital data flow signal which executes at least one analysis in the frequency plane or time-frequency-plane having a particular frequency resolution;
- at least one interposed reduction unit for reducing the sampling rate of the digital data flow signal by a particular reduction factor;
- wherein at least one multiplier which carries out complex multiplication of sampling values prior to cyclically accumulating those values in at least one buffer store;
- wherein the cycle comprises a plurality of sampling values and the cyclic accumulation occurs with timewise corresponding sampling values of at least one previous cycle;
- wherein the at least one buffer store with accumulated measured values is read corresponding to the reduction factor after at least one defined number of cycles, wherein the buffer store is purged of old sampling values; and
- whereby the analyzable bandwidth of the received spectrum is preserved to the detriment of an extended duration of an analysis section while reducing the sampling rate.

* * * * *